United States Patent
Sonkar et al.

(10) Patent No.: US 8,416,013 B1
(45) Date of Patent: Apr. 9, 2013

(54) CORE CIRCUIT LEAKAGE CONTROL

(75) Inventors: Dharmesh Kumar Sonkar, Bangalore (IN); Shahid Ali, New Delhi (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/281,722

(22) Filed: Oct. 26, 2011

(51) Int. Cl.
*G05F 1/10* (2006.01)

(52) U.S. Cl. ....................................... 327/544

(58) Field of Classification Search .................. None
See application file for complete search history.

(56) References Cited

U.S. PATENT DOCUMENTS

| | | | | |
|---|---|---|---|---|
| 7,764,101 B2 * | 7/2010 | Wu et al. | ......................... | 327/205 |
| 2009/0115258 A1 * | 5/2009 | Flynn et al. | ................... | 307/129 |

* cited by examiner

*Primary Examiner* — Lincoln Donovan
*Assistant Examiner* — Sibin Chen
(74) *Attorney, Agent, or Firm* — John R. Pessetto; W. James Brady; Frederick J. Telecky, Jr.

(57) ABSTRACT

Circuits, and methods for reducing standby leakage power in Integrated Circuit (ICs) are disclosed. In an embodiment, an IC includes a core circuit, a first switch and a second switch, where the first switch is coupled between a power terminal of the core circuit and a power supply and the second switch is coupled between a ground terminal of the core circuit and a ground supply. The first switch and the second switch are configured to power ON and OFF the core circuit. The IC includes a first feedback circuit configured to control ON and OFF states of the first switch based on voltage at the power terminal, and a second feedback circuit configured to control ON and OFF states of the second switch based on voltage at the ground terminal of the core circuit during the standby mode for maintaining the logic state of the core circuit.

8 Claims, 3 Drawing Sheets

CORE CIRCUIT LEAKAGE CONTROL

TECHNICAL FIELD

The present disclosure generally relates to leakage control in core circuits in System on Chips (SoCs).

BACKGROUND

In accordance with an exemplary scenario, leakage power consumption is a factor that is considered while designing Integrated Circuits (ICs), such as System on Chips (SoCs). To illustrate, in an exemplary SoC, leakage power consumption tends to increase as the number of circuit blocks in the SoC are increased. In such SoCs, leakage power contribution for circuit blocks, such as memory units, is also very high, even during the standby mode of operation of the memory. Leakage power saving schemes in such SoCs utilize PMOS/NMOS power switches to reduce the leakage during the standby mode of operation of the circuit blocks. Such power switches are configured to disconnect a power supply to the logic blocks during the standby mode of operation in order to reduce the leakage during the standby mode.

SUMMARY

Integrated Circuit (ICs) for reducing standby leakage current and maintaining logic states of core circuits in the ICs are disclosed. In an embodiment, an IC includes a core circuit configured to operate in a standby mode, comprising a power terminal and a ground terminal. The IC includes a first switch and a second switch, where the first switch is coupled between the power terminal of the core circuit and a power supply, and the second switch is coupled between the ground terminal of the core circuit and a ground supply. The first switch and the second switch are configured to power ON and power OFF the core circuit for controlling leakage associated with the core circuit. The IC includes a first feedback circuit coupled to the first switch and the core circuit. The first feedback circuit is configured to control ON state and OFF state of the first switch based on voltage at the power terminal of the core circuit during the standby mode for maintaining a logic state of the core circuit. The IC further includes a second feedback circuit coupled to the second switch and the core circuit, where the second feedback circuit is configured to control ON state and OFF state of the second switch based on voltage at the ground terminal of the core circuit during the standby mode for maintaining the logic state of the core circuit In some embodiments, a control circuit is disclosed, that includes a switch coupled with a terminal of the core circuit, where the switch is configured to power ON and power OFF the core circuit for controlling leakage associated with the core circuit. The control circuit also includes a feedback circuit coupled with the switch and the terminal of the core circuit. The feedback circuit is configured to control ON state and OFF state of the switch based on voltage at the terminal of the core circuit during a standby mode of operation of the core circuit, for maintaining a logic state of the core circuit. In some embodiments, a method for controlling leakage of a core circuit in an IC is disclosed. The core circuit comprises a power terminal connected to a power supply through a first switch and a ground terminal connected to a ground supply through a second switch. The method comprises sensing, during a standby mode of the core circuit, a voltage at the power terminal of a core circuit and a voltage at the ground terminal of the core circuit. The method further comprises switching ON the first switch, during the standby mode, for charging the power terminal for a first time period upon sensing the voltage at the power terminal less than a first threshold voltage. The method also comprises switching ON the second switch, during the standby mode, for discharging the ground terminal for a second time period upon sensing the potential of the ground terminal greater than a second threshold voltage.

DETAILED DESCRIPTION

Figure 1:
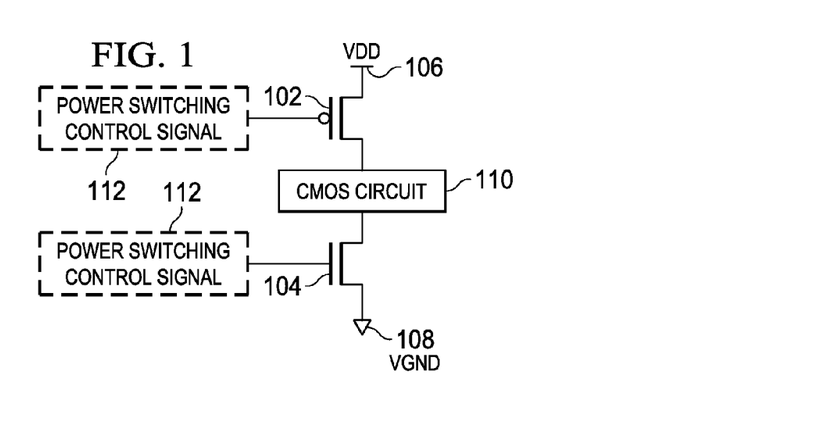
FIG. 1 is a block diagram of a circuit configured to reduce standby leakage power in an integrated circuit according to an exemplary scenario.

Pursuant to an exemplary scenario, in ICs, the circuit blocks that are not in use are temporarily turned off by utilizing power switches to reduce overall leakage power in the ICs. Referring to FIG. 1, a number of power switches are shown as being coupled with a circuit block, such as a CMOS circuit in an IC. As shown in FIG. 1, power switches, such as a PMOS header switch 102 and an NMOS footer switch 104, are shown as being coupled with a CMOS circuit 110. The PMOS header switch 102 is coupled between a power supply (for example, VDD 106) and the CMOS circuit 110, and the NMOS header switch 104 is coupled between a ground supply (for example, GND 108) and the CMOS circuit 110.

The power switches, such as the switches 102 and 104, are used to temporarily turn off the CMOS circuit 110 when the CMOS circuit 110 is not in use in order to reduce the overall leakage power of the IC. Such a temporary shutdown may be performed, for example, in cases involving a standby mode, a low power mode or an inactive mode of the CMOS circuit 110. When the CMOS circuit 110 is to be operated once again, the switches are activated, or put into an "active mode". As shown in FIG. 1, a power switching control signal 112 is provided to gate terminals of the switches 102 and 104. During the active mode, the power switching control signal 112 is configured such that the switches 102 and 104 are turned ON, whereas during the standby mode, the power switching control signal 112 is configured such that the switches 102 and 104 are turned OFF. These modes are switched at an appropriate time and in a suitable manner so as to maximize power performance while minimizing the impact to a performance of the IC.

In certain instances, when, during the standby mode, the CMOS circuit 110 is turned OFF, voltages of certain nodes of the CMOS circuit 110, such as, for example, at a power terminal and a ground terminal, may change due to leakage encountered during the standby mode. For instance, the logic level of the power terminal in the CMOS circuit 110 that might otherwise be maintained at a preselected voltage (such as at a predetermined supply voltage associated with VDD 106) starts decreasing towards a lower voltage if the CMOS circuit 110 is turned OFF for a long period during the standby mode. Similarly, the ground terminal in the CMOS circuit 110 that might otherwise be maintained at the preselected voltage (such as at a predetermined voltage associated with GND 108) starts increasing towards a higher voltage in the standby mode. Such changes in the voltages of the nodes during the standby mode may cause undesirable change in the logic levels of nodes of the CMOS circuit 110 as compared to the logic levels realized during the active mode of operation of the CMOS circuit 110.

Various embodiments of the present technology provide solutions that are capable of reducing the standby leakage power consumption while maintaining logic states of various circuit blocks in an IC. For instance, various embodiments provide methods and circuit implementations for controlling the ON/OFF states of the power switches during the standby mode to thereby achieve the combined objectives of maintaining the logic states of the circuit blocks in the IC and reducing the standby leakage power consumption. Various embodiments of the present technology are herein disclosed in conjunction with FIGS. 2-5.

Figure 2:
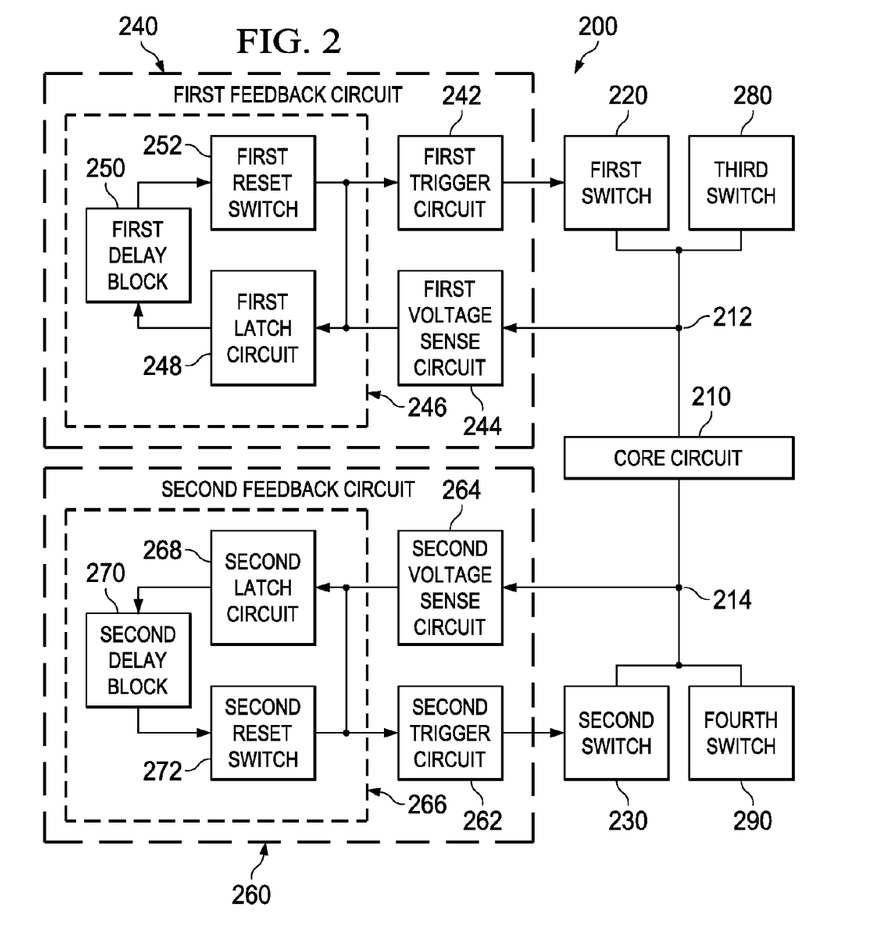
FIG. 2 is a block diagram of a circuit configured to reduce standby leakage power in an integrated circuit according to an embodiment.

FIG. 2 is a block diagram of a circuit 200 configured to reduce standby leakage power while maintaining the logic states of circuit blocks in an IC, according to an embodiment. It should be noted that the details of the block diagram of the circuit 200 are provided merely by way of illustration, and that other embodiments may contain fewer or more components, and corresponding interconnections. FIG. 2 represents the circuit 200 that may be a portion of the IC. The circuit 200 includes a logic block, such as a core circuit 210, that is coupled with or connected to the power supplies (such as a power supply VDD and a ground supply VGND) for the purpose of its operation. An example of the core circuit 210 may include any electrical or electronic circuit module, or combination of circuits, such as, for example, a memory block, a shift register, a flip-flop, and the like. The core circuit 210 may have multiple modes of operation, such as, for example, an active mode and a standby mode of operations. In the active mode, the core circuit 210 performs its functions and communicates with other components (not shown) of the IC, while in the standby mode, the core circuit 210 may be partially or entirely not functional and can be powered OFF in order to save power. Such powering OFF of the core circuit 210 helps in reducing leakage power consumption in the IC during the standby mode.

The circuit 200 includes a first switch 220 and a second switch 230 coupled with the core circuit 210. The first switch 220 is coupled between a power terminal 212 of the core circuit 210 and a power supply (not shown) of the IC. The first switch 220 is configured to electronically connect/disconnect the power supply of the IC to the power terminal 212 of the core circuit 210. The second switch 230 is coupled between a ground terminal 214 of the core circuit 210 and a ground supply (not shown) of the IC. The second switch 230 is configured to electronically connect/disconnect the ground supply of the IC to the ground terminal 214 of the core circuit 210. The circuit 200 includes a first feedback circuit 240 and a second feedback circuit 260 configured to control the ON/OFF states of the first switch 220 and the second switch 230, respectively. The first feedback circuit 240 is coupled with the first switch 220 and the core circuit 210, and the second feedback circuit 260 is coupled with the second switch 230 and the core circuit 210.

During the active mode of operation of the core circuit 210, the first feedback circuit 240 causes the first switch 220 to remain in an ON condition, thereby maintaining the voltage at the power terminal 212 to a preselected voltage (e.g., VDD). Also, during the active mode, the second feedback circuit 260 causes the second switch 230 to remain in an ON condition, thereby maintaining the voltage at the ground terminal 214 to a preselected voltage (e.g., VGND). During the standby mode of the core circuit 210, the feedback circuits 240 and 260 are configured to control the ON/OFF states of the first switch 220 and the second switch 230, respectively, based on voltage at corresponding nodes, such as power terminal 212 and ground terminal 214 of the core circuit 210.

In an embodiment, during the standby mode, the first feedback circuit 240 causes the first switch 220 to remain in the OFF state as long as the logic state of the core circuit 210 is maintained. For example, if the voltage at the power terminal 212 of the core circuit 210 is within a range such that that the logic state of the core circuit 210 is maintained (e.g., preserved), the first switch 220 remains in the OFF state as controlled by the first feedback circuit 240. Further, the first feedback circuit 240 is configured to sense the voltage at the power terminal 212, and when the voltage at the power terminal 212 decreases to a certain value (e.g., a first threshold voltage), the first switch 220 is turned ON in the standby mode, the power terminal 212 is again charged towards the preselected voltage (e.g., VDD), and the logic state of the core circuit 210 is maintained. In certain embodiments, once the voltage at the power terminal 212 of the core circuit 210 reaches VDD after charging, the first switch 210 is turned OFF in the standby mode to thereby reduce the leakage power reduction in the IC. Such a cycle of ON/OFF states of the first switch 220 is performed dynamically based on the voltage at the power terminal 212.

Similarly, during the standby mode, the second feedback circuit 260 causes the second switch 220 to remain in the OFF state as long as the logic state of the core circuit 210 is maintained. The second feedback circuit 260 is configured to sense the voltage at the ground terminal 214, and when the voltage at the ground terminal 214 increases to a certain value (e.g., a second threshold voltage), the second switch 230 is turned ON in the standby mode and the ground terminal 214 is discharged back to the preselected voltage (e.g., VGND) and the logic state of the core circuit 210 is maintained. In certain embodiments, once the ground terminal 214 of the core circuit 210 reaches VGND after discharging, the second switch 220 is turned OFF in the standby mode to thereby reduce the leakage power reduction in the IC. Such a cycle of ON/OFF states of the second switch 230 is performed dynamically based on the voltage at the ground terminal 214.

In various embodiments, the feedback circuits 240 and 260 may be configured in a variety of ways, such as by utilizing a specific circuit element or combinations of circuit elements (e.g., amplifiers, diodes, capacitors, resistors, and the like). In an embodiment, the feedback circuits 240 and 260 may be configured as a combination of various circuitries. In some embodiments, the feedback circuits 240 and 260 include a sense circuit configured to sense the voltage level of a node, such as the power terminal 212 and the ground terminal 214 of the core circuit 210, a trigger circuit configured to control the ON/OFF states of the switches, such as the first switch 220 and the second switch 230, and a reset circuit configured to control the time period for the ON/OFF states of the switches 220 and 230.

In the embodiment shown in FIG. 2, the first feedback circuit 240 includes a first trigger circuit 242, a first voltage sense circuit 244 and a first reset circuit 246; the second feedback circuit 260 includes a second trigger circuit 262, a second voltage sense circuit 264, and a second reset circuit 266. The first trigger circuit 242 is configured to generate a trigger signal for controlling an ON state and an OFF state of the first switch 220 in response to a control signal received from the sense circuit 244 and a standby mode signal. For instance, the sense circuit 244 is coupled with the power terminal 212, and is configured to sense the voltage at the power terminal 212 and assert the control signal when the voltage at the power terminal 212 becomes less than the first threshold voltage. As the sense circuit 244 asserts the control signal, during the standby mode (as the standby mode signal is also asserted in the standby mode), the trigger circuit 242 is configured to generate a trigger signal that causes the first switch 220 to turn ON.

The first reset circuit 246 is coupled with or connected to the output (not shown) of the sense circuit 244, and is configured to reset the control signal after a threshold delay from a time when the control signal is asserted. In some embodiments, the first reset circuit 246 includes a first latch circuit 248, first delay circuit 250 and a first reset switch 252. The latch circuit 248 is configured to receive and store the control signal. The delay circuit 250 is coupled with the output of the latch circuit 248 and receives the control signal from the latch circuit 248. The delay circuit 250 is configured to provide a reset signal at an output of the delay circuit 250 after the threshold delay associated with the receipt of the control signal. The reset switch 252 is coupled with or connected to the output of the delay circuit 250 and is configured to reset the control signal (e.g., output of the sense circuit 244) in response to the reset signal received from the output of the delay circuit 250. As the control signal is reset, the trigger circuit 242 is configured to generate the trigger signal that causes the first switch 220 to turn OFF.

With reference still to FIG. 2, the second feedback circuit 260 includes a second trigger circuit 262, a second voltage sense circuit 264 and a second reset circuit 266. The second trigger circuit 262 is configured to generate a trigger signal for controlling an ON state and an OFF state of the second switch 230 in response to a control signal received from the sense circuit 264 and the standby mode signal. For instance, the sense circuit 264 is coupled with the ground terminal 214 of the core circuit 210, and is configured to sense the voltage at the ground terminal 214 and assert the control signal when the voltage at the ground terminal 214 is greater than the second threshold voltage. As the sense circuit 264 asserts the control signal, during the standby mode (as the standby mode signal is also asserted in the standby mode), the trigger circuit 262 is configured to generate a trigger signal that causes the second switch 220 to turn ON.

The second reset circuit 266 is coupled with or connected to the output (not shown) of the sense circuit 264, and is configured to reset the control signal after a threshold delay from the time when the control signal is asserted. In some embodiments, the second reset circuit 266 includes a second latch circuit 268, a second delay circuit 270 and a second reset switch 272. The latch circuit 268 is configured to receive and store the control signal. The delay circuit 270 is coupled with or connected to the output of the latch circuit 268 and receives the control signal from the latch circuit 268. The delay circuit 270 is configured to provide the control signal at an output of the delay circuit 270 with a threshold delay. The reset switch 272 is coupled with or connected to the output of the delay circuit 270 and is configured to reset the control signal (e.g., output of the sense circuit 264) in response to the control signal received from the output of the delay circuit 270. As the control signal is reset, the trigger circuit 262 is configured to generate the trigger signal that causes the second switch 230 to turn OFF.

In one embodiment, the circuit 200 also includes a third switch 280 coupled between the power supply and the power terminal 212 of the core circuit 210. The third switch 280 is configured to provide Direct Current (DC) to the core circuit 210 so as to maintain the logic state of the core circuit 210. In one embodiment, the circuit 200 also includes a fourth switch 290 coupled between the ground supply and the ground terminal 214 of the core circuit 210. The fourth switch 290 is configured to provide DC to the core circuit 210 so as to maintain the logic state of the core circuit 210. In one embodiment, the third switch 280 and the fourth switch 290 are weak Metal Oxide Semiconductor (MOS) transistors and are capable of providing DC to the core circuit 210 by compensating the leakage current inherent in the core circuit 210 to thereby ensure a low voltage operation of the core circuit 210.

Figure 3:
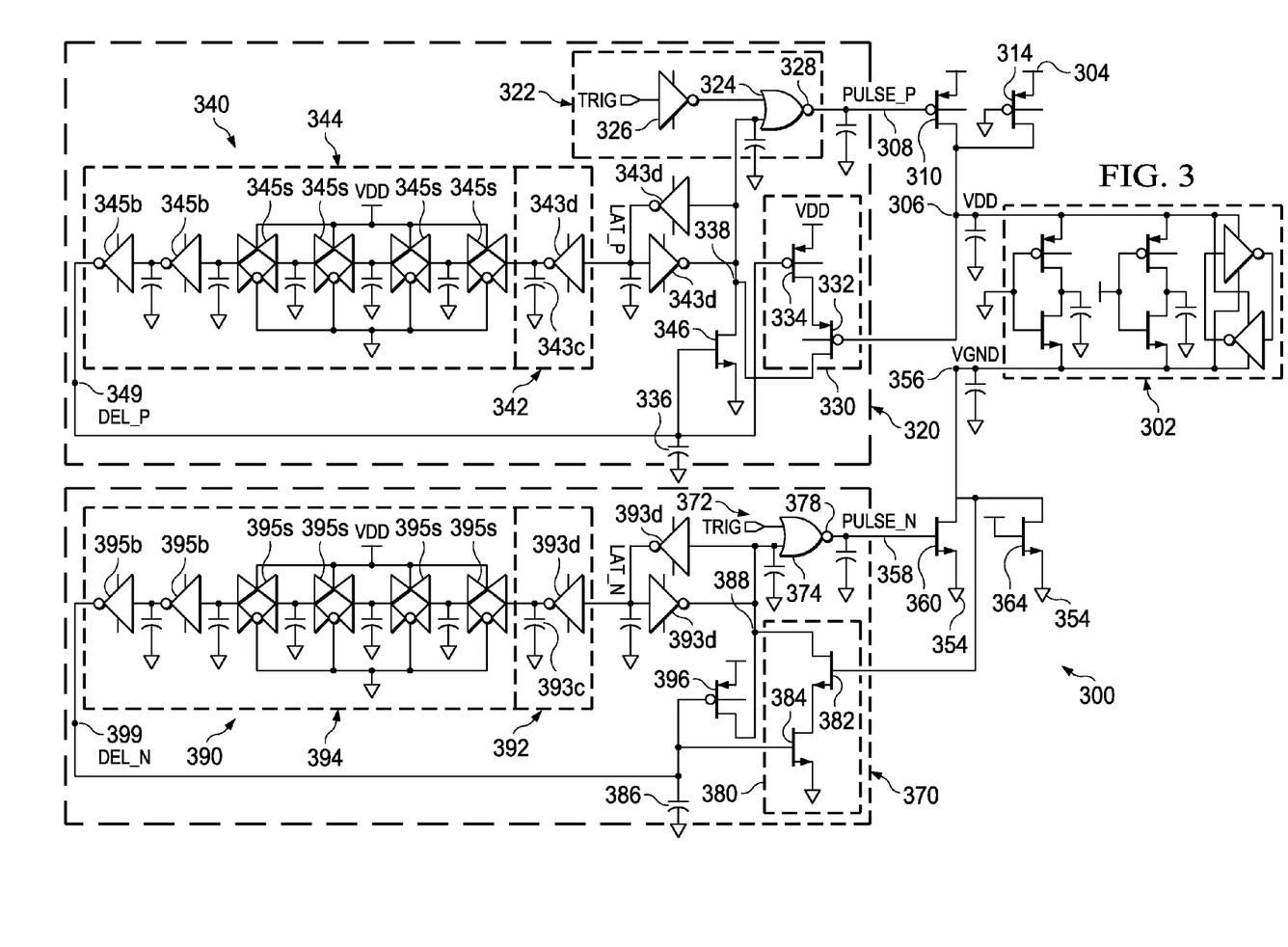
FIG. 3 is a circuit diagram of a circuit configured to reduce standby leakage power in an integrated circuit according to an embodiment.

The switches 210 and 220 and the feedback circuits 230 and 240 may be implemented as interconnections of electronic elements and circuits, and modules such as an Application Specific Integrated Circuit (ASIC), a Field Programmable Gate Array (FPGA), and the like. An exemplary embodiment of a circuit for reducing standby leakage power while maintaining a logic state of a core circuit of an integrated circuit is further described in conjunction with FIG. 3 according to an embodiment. With reference to FIG. 3, a core circuit 302, which may be an example of a memory element, is shown. The integrated circuit 300 includes a first switch 310 (also referred to as a "header switch") and a second switch 360 (also referred to as a "footer switch"). In the embodiment shown in FIG. 3, the header switch 310 is shown as a PMOS switch, and the footer switch 360 is shown as a NMOS switch; however, this should not be considered as limiting the scope of the present technology. Moreover, these switches can be interchanged, or can be other types of switches, such as, for example, bipolar transistors switches, Bipolar Complementary Metal Oxide Semiconductor (BiCMOS) switches and transmission switches.

The header switch 310 is coupled between a power supply 304 and a power terminal 306 of the core circuit 302. In an embodiment, when the header switch 310 is in an ON state, the power supply 304 is coupled with the power terminal 306, and the preselected voltage (for example, VDD) is maintained at the power terminal 306. Similarly, the footer switch 360 is coupled between a ground supply 354 and a ground terminal 356 of the core circuit 302. In an embodiment, when the footer switch 360 is in an ON state, the ground terminal 356 of the core circuit 302 is coupled with or connected to the ground supply 354, and the ground voltage (for example, VGND) is maintained at the ground terminal 356.

As shown in FIG. 3, a first feedback circuit 320 controls the operation of the header switch 310 and a second feedback circuit 370 controls the operation of the footer switch 360. During the active mode, the first feedback circuit 320 causes the header switch 310 to remain in the ON state, thereby powering the power terminal 306 to the VDD. Also, during the active mode, the second feedback circuit 370 causes the footer switch 360 to remain in the ON state, thereby electronically connecting the ground terminal 356 to the ground supply 354.

In certain embodiments, during the standby mode, the first feedback circuit 320 causes the header switch 310 to attain an ON or OFF state, depending upon the voltage level of the power terminal 306 of the core circuit 302, in order to maintain the logic state of the core circuit 302. Specifically, the feedback circuit 320 is configured to cause the header switch 310 to remain in the OFF state during the standby mode; however, when the voltage level of the power terminal 306 discharges from the preselected voltage (e.g., VDD) by a certain voltage (e.g., the first threshold voltage), the feedback circuit 320 causes the header switch 310 to attain the ON state. Upon turning ON the header switch 310, the voltage level of the power terminal 306 is maintained at the preselected voltage. In certain embodiments, during the standby mode, once the voltage level of the power terminal 306 reaches that of VDD, the first feedback circuit 320 is configured to switch OFF the header circuit 310 again in order to reduce the leakage power consumption. In certain embodiments, in the standby mode, the first feedback circuit 320 is configured to periodically or non-periodically control the ON/OFF states of the header switch 310 in order to maintain the logic state of the core circuit 302 and reduce the leakage power consumption. In similar arrangements, the second feedback circuit 370 is configured to periodically or non-periodically control the ON/OFF states of the second switch 360 in order to maintain the ground voltage (e.g., VGND) at the ground terminal 356 of the core circuit 302 and reduce the leakage power consumption.

In the embodiment shown in FIG. 3, each of the feedback circuits 320 and 370 includes a trigger circuit, a sense circuit and a reset circuit. For instance, the first feedback circuit 320 includes a first trigger circuit 322, a first voltage sense circuit 330 and a first reset circuit 340, and the second feedback circuit 370 includes a second trigger circuit 372, a second voltage sense circuit 380, and the second reset circuit 390.

The exemplary representations of first and second trigger circuits 322 and 372 are presented in accordance with an exemplary embodiment. However, the present technology is not limited to these exemplary configurations; indeed, these circuits may be configured in a variety of ways. In the embodiment shown in FIG. 3, the first trigger circuit 322 includes circuitries for providing a trigger signal to the header switch 310 in response to a control signal and a standby mode signal. The control signal is a signal indicative of the voltage level at the power terminal 306, and the standby mode signal represents the standby mode of operation of the core circuit 302. For instance, the first trigger circuit 322 includes a gate, such as NOR gate 324, that receives two inputs, such as an inverted standby mode signal (by inverter 326; the standby mode signal is shown as "TRIG" in FIG. 3) and the control signal (see signal LAT_P). An output 328 of the NOR gate 324 (see signal PULSE_P) is provided to a gate terminal 308 of the first switch 310.

In the embodiment shown in FIG. 3, the first voltage sense circuit 330 includes two PMOS transistors 332 and 334. In this embodiment, the gate of the transistor 332 is coupled with the power terminal 306 of the core circuit 302. The PMOS transistor 334 is coupled with the PMOS transistor 332 in a serial connection and is coupled with the power supply (VDD), as shown in FIG. 3. A gate terminal of the PMOS transistor 334 is coupled with or connected to a biasing capacitor 336. The PMOS transistor 332 is configured to sense the voltage level of the power terminal 306. When the voltage at the power terminal 306 decreases to the first threshold voltage, such as, for example, threshold voltage (Vt) of the PMOS transistor 332, it causes the transistor 332 to turn ON, and the node 338 attains a logic "1" Level. Accordingly, the control signal LAT_P (at logic "1" level) is fed to the NOR gate 324. During the standby mode, the standby mode signal (see TRIG) is at logic "1" and the output of the inverter 326 is at logic "0". As the signal LAT_P (logic "1") and the inverted trigger input (logic "1") are input to the NOR gate 324, the output 328 of the NOR gate 324 (also shown as signal PULSE_P) also attains a logic "0" level. As the PULSE_P signal is at logic "0", the header switch 310 to switched ON and the power terminal 306 is charged towards VDD.

The reset circuit 340 includes a latch circuit 342, a delay circuit 344 and a reset NMOS transistor 346. The latch circuit 342 is configured to hold or store the voltage level of the signal LAT_P utilizing inverters 243d and a capacitor 243c. The delay circuit 344 includes a plurality of delay blocks connected in series, such as switches 345s and buffers 345b. The delay circuit 344 is configured to provide a reset signal (see signal DEL_P) at an output 349 of the delay circuit 344 after the threshold delay. In certain embodiments, the reset signal is the LAT_P signal delayed by the threshold delay.

The output 349 of the delay circuit 344 is coupled with a gate of the reset NMOS transistor 346. It should be noted that the threshold delay may be customized based on the number of delay blocks in the delay circuit 344. It should also be noted that the reset signal (see DEL_P) is provided to a gate terminal of the reset NMOS transistor 346, after the threshold delay associated with the receipt of the control signal (LAT_P) by the delay circuit 344. As the DEL_P signal is at logic "1", it causes the transistor 346 to switch ON and the voltage at the node 338 is pulled down to logic "0". Accordingly, the control signal (LATP) switches to logic "0" from logic "1", and, in turn, the PULSE_P also attains logic "1". As the PULSE_P attains the logic "1", the header switch 310 is turned OFF, and the power terminal 306 is electronically disconnected or uncoupled from the power supply 304. In this manner, when the voltage level of the power terminal 306 discharges from VDD to the Vt of the PMOS transistor 332, the header switch 310 is turned ON and the voltage at the power terminal is maintained at near or equal to the VDD level. Further, after a fixed threshold delay, the reset circuit 340 causes the header switch 310 to turn OFF to thereby reduce the leakage power during the standby mode of operation of the core circuit 302. In a similar manner, the second feedback circuit 370, including the second trigger circuit 372, the second voltage sense circuit 380, and the second reset circuit 390, maintains the ground level of voltage at the ground terminal 356 of the core circuit 302 while reducing the leakage power during the standby mode of operation of the core circuit 302. For instance, in the embodiment shown in FIG. 3, the second trigger circuit 372 includes a gate, such as NAND gate 374 that receives two inputs, such as a standby mode signal (see TRIG) and the control signal (see LAT_N). An output 378 of the NAND gate 374 (see the signal PULSE_N) is provided to a gate terminal 358 of the second switch 360.

In the embodiment shown in FIG. 3, the second voltage sense circuit 380 includes two NMOS transistors 382 and 384. In this embodiment, the gate of the transistor 382 is coupled with the ground terminal 356 of the core circuit 302. The NMOS transistor 384 is coupled with the NMOS transistor 382, such as in a serial connection, and a gate of the NMOS transistor 384 is connected to a biasing capacitor 386. The NMOS transistor 382 is configured to sense the voltage level of the ground terminal 356. When the voltage at the ground terminal 356 increases to a threshold voltage (Vt) of the NMOS transistor 382, the transistor 382 is switched to an ON state, and the node 388 attains a logic "0" level. Accordingly, the control signal (LAT_N, at logic "0" level) is fed to the NAND gate 374. During the standby mode, the standby mode signal is at logic "1". As the signal LAT_N (logic "0") and the trigger input (logic "1") are input to the NAND gate 374, the output 378 of the NAND gate 374 (see signal PULSE_N) attains a logic "1" level. As the PULSE_N signal attains logic "1", the footer switch 360 is switched to an ON state and the ground terminal 356 is discharged towards the preselected voltage (VGND) such that the logic state of the core circuit 302 is maintained.

The reset circuit 390 includes a latch circuit 392, a delay block 394 and a reset PMOS transistor 396. The latch circuit 392 is configured to hold the voltage level of the signal LAT_N by the inverters 293d and a capacitor 293c. The delay block 394 includes a plurality of delay blocks coupled or connected in series, such as switches 395s and buffers 395b. The delay circuit 394 is configured to provide a reset signal (see signal DEL_N) at output 399 of the delay circuit 394 after the threshold delay. In certain embodiments, the reset signal is the LAT_N signal delayed by the threshold delay.

The output 399 of the delay circuit 394 is coupled with a gate of the reset PMOS transistor 396 after the threshold delay. It should be noted that the threshold delay may be customized based on the number of delay blocks in the delay circuit 394. It should also be noted that the reset signal (see DEL_N) is provided to a base of the reset NMOS transistor 396 after the threshold delay associated with the receipt of the control signal (LAT_N) by the delay circuit 394. As the DEL_N signal is at logic "0", the transistor 396 is turned ON and the voltage at the node 388 is pulled up to logic "1" (which may be, for example, its default value during the standby mode). Accordingly, the control signal (DEL_N) switches to logic "1" from logic "0", and, in turn, the trigger signal (PULSE_N) attains logic "0". As the PULSE_N attains logic "0", the footer switch 360 is turned OFF, and the ground terminal 356 is electronically disconnected or uncoupled from the ground supply 354. In this manner, when the voltage level of the ground terminal 356 increases from VGND towards Vt of the NMOS transistor 382, the footer switch 360 is turned ON and the voltage at the ground terminal 356 is again maintained near or equal to the VGND level. Further, after the fixed threshold delay, the reset circuit 390 causes the footer switch 360 to turn OFF to thereby reduce the leakage power during the standby mode of operation of the core circuit 302.

In one embodiment, the IC 300 also includes a third switch 314 coupled between the power supply 304 and the power terminal 306 of the core circuit 302. The third switch 314 is configured to provide DC to the core circuit 302 so as to maintain the logic state of the core circuit 302. In the embodiment shown in FIG. 3, the third switch 314 is a weak PMOS switch and always remains in an ON condition in order to provide DC to the core circuit 302, by compensating the leakage current inherent in the core circuit 302, to thereby ensure low voltage operation of the core circuit 302. In one embodiment, the IC 300 also includes a fourth switch 364 coupled between the ground supply 354 and the ground terminal 356 of the core circuit 302. The fourth switch 364 is also configured to provide DC to the core circuit 210 to thereby maintain the logic state of the core circuit 210. In one embodiment, the fourth switch 364 is a weak NMOS switch and always remains in an ON condition in order to provide DC to the core circuit 302.

Figure 4:
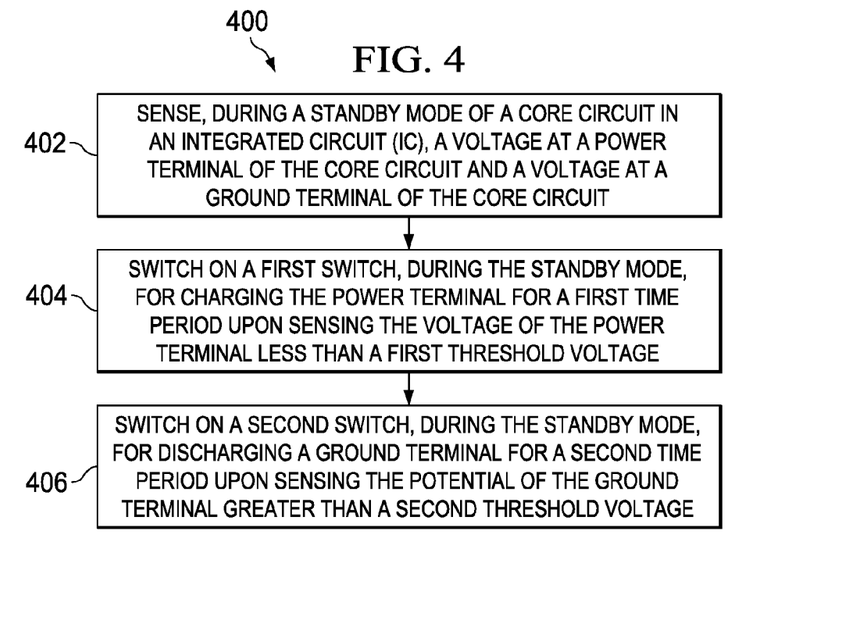
FIG. 4 is a flow diagram of a method of reducing standby leakage power in an integrated circuit according to an embodiment.

FIG. 4 is a flowchart illustrating the manner in which reduction of the leakage power consumption in standby mode in a core circuit is facilitated, in an embodiment of the present technology. The core circuit may be an example of the core circuits 210 or 302. The core circuit comprises a power terminal that is coupled with or connected to a power supply through a first switch, such as the first switches 220 or 310. The core circuit also comprises a ground terminal that is coupled with or connected to a ground supply through a second switch, such as the second switches 230 or 360. For purposes of illustration, the flowchart is described with respect to the devices and components of FIGS. 2 and 3. However, various features described herein can be implemented in other environments and using other components. Furthermore, the steps in the flowchart are described in a specific sequence for purposes of illustration. Other embodiments using a different sequence of steps can also be implemented without departing from the scope and spirit of several aspects of the present technology.

At 402, the method 400 includes sensing voltages at the power terminal and the ground terminal of the core circuit, such as the core circuit 302, during the standby mode of the core circuit. The voltages at the power terminal and the ground terminal may be sensed by suitable mechanisms including, but not limited to, sense amplifiers. Further, at 404, the method 400 includes switching ON the first switch, during the standby mode, to charge the power terminal for a first time period upon sensing that the voltage at the power terminal is less than a first threshold voltage. In certain embodiments, during the standby mode, the first switch is switched OFF and the power terminal of the core circuit does not draw power from the power supply. As the power terminal is electronically disconnected or uncoupled from the power supply in the standby mode, the voltage at the power terminal starts decreasing from a preselected voltage (e.g., 5V) towards the first threshold voltage (e.g., 2.5V). In certain embodiments, the first switch is switched ON by asserting a control signal when the voltage at the power terminal is less than the first threshold voltage, and generating a trigger signal based on the asserted control signal and a standby mode signal. The trigger signal is configured to switch ON the first switch. Without limiting the scope of the present technology, it is noted that the control signal may be generated by a sense amplifier circuit, such as the sense circuits 244 or 330, and the trigger signal may be generated by a trigger circuit, such as the trigger circuits 242 or 322. The method 400 further includes switching OFF the first switch after the first time period by performing a reset of the control signal, as the voltage at the power terminal is charged back to the preselected voltage (which may be equal to or approximately 5V). In an embodiment, such a switching OFF of the first switch may be performed utilizing circuits such as reset circuits 246 or 340.

Further, at 406, the method 400 includes switching ON the second switch, during the standby mode, to thereby discharge the ground terminal during a second time period upon sensing that the voltage at the ground terminal is more than a second threshold voltage. In certain embodiments, during the standby mode, the second switch is switched OFF and the ground terminal of the core circuit is not connected to the ground supply. As the ground terminal is electronically disconnected or uncoupled from the ground supply in the standby mode, the voltage at the ground terminal starts increasing from a preselected voltage (e.g., 0V) towards the second threshold voltage (e.g., 2.5V). In certain embodiments, the second switch is switched ON by asserting a control signal when the voltage at the ground terminal is more than the second threshold voltage, and generating a trigger signal based on the asserted control signal and the standby mode signal. The trigger signal is configured to switch ON the second switch. Without limiting the scope of the present technology, it is noted that the control signal may be generated by a sense amplifier, such as the sense circuits 264 or 380, and the trigger signal may be generated by a trigger circuit, such as the trigger circuits 262 or 372. The method 400 further includes switching OFF the first switch after the first threshold time by performing a reset of the control signal, as the voltage at the power terminal is charged back to the preselected voltage (which may be equal to or approximately 5V). In an embodiment, such a switching OFF of the first switch may be performed utilizing circuits such as reset circuits 266 or 390.

The embodiments shown in FIGS. 2, 3 and 4 are directed to sensing the voltages at two terminals of a core circuit, such as a power terminal and a ground terminal during the standby mode, and maintaining a preselected voltage at these two terminals when it is sensed that voltages at the two terminals have changed considerably, which can otherwise change the logic state of the core circuit. However, various embodiments of the present technology are not limited to merely sensing the voltage at the two terminals, and, in some embodiments, voltages at more or fewer terminals of the core circuit may be sensed and their corresponding voltages may be restored by utilizing proper switches. One such embodiment is shown in FIG. 5, where voltage at only one terminal of the core circuit is sensed and its voltage is restored if it changes considerably, which can change the logic state of the core circuit.

Figure 5:
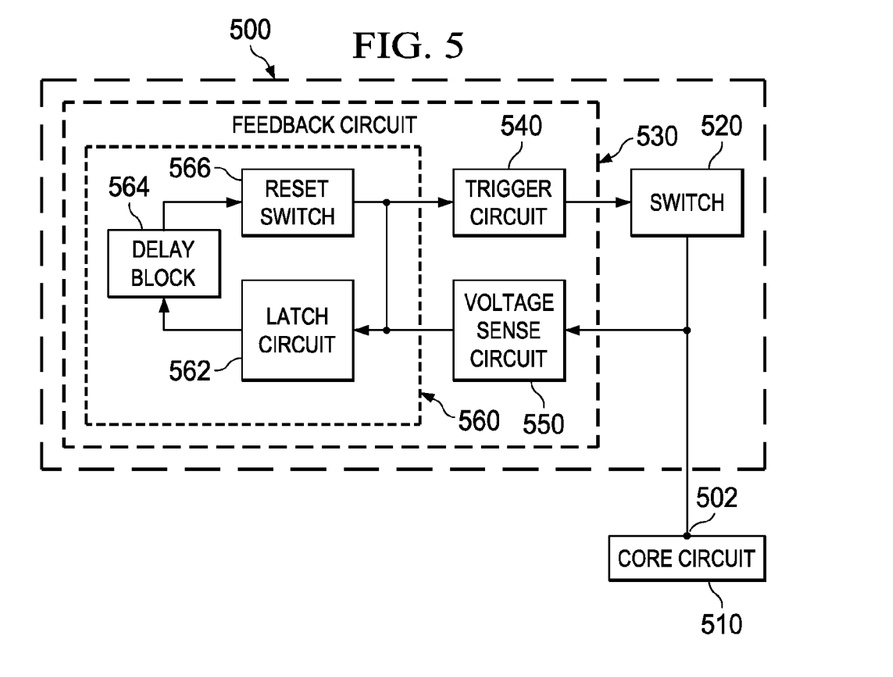
FIG. 5 is a block diagram of a circuit configured to reduce standby leakage power in an integrated circuit according to an embodiment.

Referring now to FIG. 5, a control circuit 500 is shown as being coupled with or connected to a core circuit 510 such that leakage power consumption in the core circuit is reduced while a logic state of the core circuit 510 is maintained. The control circuit 500 includes a switch 520 coupled with a terminal 502 of the core circuit 510. The terminal 502 may be, for example, a power terminal or a ground terminal. In certain embodiments, the terminal 502 is a terminal other than the power terminal and the ground terminal of the core circuit 510. The switch 520 is configured to power ON and power OFF the core circuit to thereby control leakage associated with the core circuit. In certain embodiments, the switch 520 is coupled between a power supply (such as power sources supplying VDD or VGND) and the terminal 502. When the switch 520 is switched ON, the terminal 502 is coupled with or connected to the power supply, and when the switch 520 is switched OFF, the terminal 502 is electronically disconnected or uncoupled from the power supply. During active mode of operation of the core circuit 510, the switch 520 is in an ON condition; however, during standby mode of the core circuit 510, the switch 520 is in selectively switched ON and OFF depending upon the voltage at the terminal 502 such that both objectives of reducing standby leakage power consumption and the maintaining logic state of the core circuit may be achieved.

The control circuit 500 includes a feedback circuit 530 that may be an example of the feedback circuits 320 or 370. In this embodiment, the feedback circuit 530 is configured to control a switching ON and OFF of the switch 520. In an embodiment, the feedback circuit 530 is configured to turn ON the switch 520 when the voltage at the terminal 502 reaches a threshold value, and a switching ON of the switch 520 enables the voltage at the terminal to achieve a voltage preselected (for example, VDD or VGND) to maintain the logic state of the core circuit 510 during the standby mode. The feedback circuit 530 is configured to turn OFF the switch 520 after a threshold time period from a time of switching ON the switch 520 to thereby reduce the leakage power consumption during the standby mode. The feedback circuit 530 includes a trigger circuit 540, a voltage sense circuit 550 and a reset circuit 560, including a latch circuit 562, a delay circuit 564 and a reset switch 566. In an embodiment, the trigger circuit 540 is similar to the trigger circuits 242, 262, 322 or 372, the voltage sense circuit 550 is similar to 244, 264, 330 or 380, and the reset circuit 560 is similar to the 246, 266, 340 or 390, and their description is not provided again for the sake of brevity of the description.

Without in any way limiting the scope, interpretation, or application of the claims appearing below, advantages of one or more of the exemplary embodiments disclosed herein is to provide ICs capable of reducing standby leakage power associated with logic blocks in the ICs. Various embodiments provide mechanisms for dynamically controlling ON/OFF of the power switches such as header and/or footer switches during the standby mode for achieving both objectives of reducing the standby leakage power consumption while maintaining logic state of the logic blocks. It should be noted that reference throughout this specification to features, advantages, or similar language does not imply that all of the features and advantages should be, or are in, any single embodiment. Rather, language referring to the features and advantages is understood to mean that a specific feature, advantage, or characteristic described in connection with an embodiment is included in at least one embodiment of the present technology. Thus, discussions of the features and advantages, and similar language, throughout this specification may, but do not necessarily, refer to the same embodiment.

Various embodiments of the present disclosure, as discussed above, may be practiced with steps and/or operations in a different order, and/or with hardware elements in configurations which are different than those which are disclosed. Therefore, although the technology has been described based upon these exemplary embodiments, it is noted that certain modifications, variations, and alternative constructions are apparent and well within the spirit and scope of the technology. Although various exemplary embodiments of the present technology are described herein in a language specific to structural features and/or methodological acts, the subject matter defined in the appended claims is not necessarily limited to the specific features or acts described above. Rather, the specific features and acts described above are disclosed as exemplary forms of implementing the claims.

What is claimed is:

1. An integrated circuit configured for core circuit leakage control, the integrated circuit comprising:
   a core circuit configured to operate in a standby mode, the core circuit comprising a power terminal and a ground terminal;
   a first switch and a second switch, the first switch coupled between the power terminal and a power supply, the second switch coupled between the ground terminal and a ground supply, the first switch and the second switch configured to power ON and power OFF the core circuit to thereby control leakage associated with the core circuit;
   a first feedback circuit coupled with the first switch and the core circuit, configured to control an ON state and an OFF state of the first switch based on voltage at the power terminal during the standby mode to thereby maintain a logic state of the core circuit; and
   a second feedback circuit coupled with the second switch and the core circuit, configured to control an ON state and an OFF state of the second switch based on voltage at the ground terminal of the core circuit during the standby mode to thereby maintain the logic state of the core circuit;
   wherein the first feedback circuit comprises:
      a first trigger circuit configured to generate a trigger signal for controlling the ON state and the OFF state of the first switch in response to a control signal and a standby mode signal;
      a first voltage sense circuit coupled with the power terminal and the first trigger circuit, configured to generate the control signal at an output in response to the voltage at the power terminal, wherein the control signal is asserted when the voltage at the power terminal is less than a first threshold voltage; and a first reset circuit coupled to the output of first voltage sense circuit, configured to reset the control signal upon a threshold delay from a time of assertion of the control signal.

2. The integrated circuit of claim 1, wherein the first reset circuit comprises:
a first latch circuit coupled with the output of the first voltage sense circuit, configured to hold the control signal;
a first delay circuit configured to receive the control signal from the first latch circuit and generate a reset signal at an output of the first delay circuit after a threshold delay of receiving the control signal; and
a first reset switch coupled with the output of the first delay circuit, configured to reset the control signal in response to the reset signal received from the output of the first delay circuit.

3. The integrated circuit of claim 1, wherein the second feedback circuit comprises:
a second trigger circuit configured to generate a trigger pulse for controlling the ON state and the OFF state of the second switch in response to a control signal and a standby mode signal;
a second voltage sense circuit coupled with the power terminal and the second trigger circuit, configured to generate the control signal at an output in response to the voltage at the ground terminal, wherein the control signal is asserted when the voltage at the ground terminal is greater than a second threshold voltage; and
a second reset circuit coupled to the output of the second voltage sense circuit, configured to reset the control signal upon a threshold delay from a time of assertion of the control signal.

4. The integrated circuit of claim 3, wherein the second reset circuit comprises:
a second latch circuit coupled with the output of the second voltage sense circuit, configured to hold the control signal;
a second delay circuit configured to receive the control signal from the second latch circuit and generate a reset signal at an output of the second delay circuit after a threshold delay of receiving the control signal; and
a second reset switch coupled with the output of the second delay circuit, configured to reset the control signal in response to the reset signal received from the output of the second delay circuit.

5. The integrated circuit of claim 1, further comprising:
a third switch coupled between the power supply and the power terminal of the core circuit, configured to provide Direct Current (DC) requirement of the core circuit for maintaining the logic state of the core circuit.

6. The integrated circuit of claim 1, further comprising:
a fourth switch coupled between the ground terminal of the core circuit and the ground supply, configured to provide Direct Current (DC) to the core circuit for maintaining the logic state of the core circuit.

7. A control circuit for controlling leakage through a core circuit in an Integrated Circuit (IC), the control circuit comprising:
a switch coupled with a terminal of the core circuit, configured to power ON and power OFF the core circuit for controlling leakage associated with the core circuit; and
a feedback circuit coupled with the switch and the terminal, configured to control an ON state and an OFF state of the switch based on voltage at the terminal during a standby mode of operation of the core circuit, for maintaining a logic state of the core circuit
wherein during the standby mode the feedback circuit is configured to:
switch ON the switch when the voltage at the terminal reaches a threshold value, and wherein turning ON of the switch enables the voltage at the terminal at achieve a voltage required to maintain the logic state of the core circuit during the standby mode; and
switch OFF the switch after a threshold time period from a time of switching ON the switch for reducing the leakage power consumption;
wherein the feedback circuit comprises:
a trigger circuit configured to generate a trigger pulse for controlling the ON state and the OFF state of the switch in response to a control signal and a standby mode signal;
a voltage sense circuit coupled to the terminal of the core circuit and the trigger circuit, configured to sense the voltage at the terminal and generate the control signal at an output when the voltage at the terminal reaches the threshold voltage; and
a reset circuit coupled to the output of the voltage sense circuit, configured to reset the control signal upon the threshold time period from the generation of the control signal.

8. The control circuit of claim 7, wherein the reset circuit comprises:
a latch circuit coupled with the output of the voltage sense circuit, configured to hold the control signal;
a delay circuit configured to receive the control signal from the latch circuit and provide the reset signal at an output of the delay circuit after the threshold time period; and
a reset switch coupled with the output of the delay circuit, configured to reset the control signal in response to the reset signal received from the output of the delay circuit.

* * * * *